ization by a second carrier type. The pixel cell also includes a gate of a transistor adjacent to the photodiode and may include readout circuitry for reading out the charge generated and amplified by the photodiode.
United States Patent

Mouli

(10) Patent No.: US 8,039,287 B2
(45) Date of Patent: Oct. 18, 2011

(54) METHOD OF FORMING HIGH GAIN, LOW NOISE, PHOTODIODE SENSOR FOR IMAGE SENSORS

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 364 days.

(21) Appl. No.: 11/034,751

(22) Filed: Jan. 14, 2005

(65) Prior Publication Data

US 2005/0145848 A1    Jul. 7, 2005

Related U.S. Application Data

(62) Division of application No. 10/645,645, filed on Aug. 22, 2003.

(51) Int. Cl.
*H01L 31/0256* (2006.01)

(52) U.S. Cl. ............ 438/59; 257/E27.133; 257/E31.003

(58) Field of Classification Search .......... 257/290–293, 257/E27.13, E27.133; 438/59
See application file for complete search history.

(56) References Cited

U.S. PATENT DOCUMENTS

| | | | |
|---|---|---|---|
| 5,557,121 A | | 9/1996 | Kozuka et al. |
| 5,818,322 A | | 10/1998 | Tasumi |
| 5,847,409 A | | 12/1998 | Nakayama |
| 6,117,702 A | * | 9/2000 | Nakamura et al. ............. 438/57 |
| 6,127,692 A | * | 10/2000 | Sugawa et al. ................. 257/30 |
| 6,232,626 B1 | * | 5/2001 | Rhodes ......................... 257/292 |
| 6,403,975 B1 | | 6/2002 | Brunner et al. |
| 6,462,365 B1 | | 10/2002 | He et al. |
| 6,489,643 B1 | * | 12/2002 | Lee et al. ...................... 257/292 |
| 6,587,142 B1 | | 7/2003 | Kozlowski et al. |
| 6,762,401 B2 | | 7/2004 | Lee |
| 2002/0024058 A1 | | 2/2002 | Marshall et al. |
| 2002/0171077 A1 | * | 11/2002 | Chu et al. ........................ 257/19 |
| 2003/0218678 A1 | | 11/2003 | Lin et al. |
| 2004/0079408 A1 | * | 4/2004 | Fetzer et al. .................. 136/262 |

OTHER PUBLICATIONS

V. Chandramouli, et al.—"Design Considerations for High Performance Avalanche Photodiode Multiplication Layers," IEEE Transactions on Electron Devices, vol. 41, No. 5, May 1994.
R. J. McIntyre—"Multiplication Noise in Uniform Avalanche Diodes," IEEE Transactions on Electron Devices, vol. ED-13, No. 1, Jan. 1966.
R. J. McIntyre—"A New Look at Impact Ionization—Part I: A Theory of Gain, Noise, Breakdown Probability, and Frequency Response," IEEE Transactions on Electron Devices, vol. 46, No. 8, Aug. 1999.

* cited by examiner

*Primary Examiner* — Colleen Matthews
(74) *Attorney, Agent, or Firm* — Dickstein Shapiro LLP (57) ABSTRACT

Embodiments of the present invention provide a pixel cell for an image sensor that includes a photodiode, which provides high gain, low noise, and low dark current. The pixel cell includes a photodiode comprising layers of a first material and at least a second material in contact with one another. The photodiode generates charge in response to light and also amplifies the charge. The layers may be configured to promote impact ionization by a first carrier type and suppress impact ionization by a second carrier type. The pixel cell also includes a gate of a transistor adjacent to the photodiode and may include readout circuitry for reading out the charge generated and amplified by the photodiode.

28 Claims, 10 Drawing Sheets

METHOD OF FORMING HIGH GAIN, LOW NOISE, PHOTODIODE SENSOR FOR IMAGE SENSORS

CROSS-REFERENCE TO RELATED APPLICATION

The present application is a divisional application of U.S. patent application Ser. No. 10/645,645, filed on Aug. 22, 2003, the disclosure of which is incorporated herein by reference in its entirety.

FIELD OF THE INVENTION

The present invention relates to the field of semiconductor image sensors, and particularly to a high gain photodiode for an image sensor.

BACKGROUND OF THE INVENTION

CMOS image sensors are increasingly being used as low cost imaging devices over Charge Coupled Device (CCD) image sensors. A conventional CMOS image sensor circuit includes a focal plane array of pixel cells, each one of the cells includes a photo-conversion device for generating charge in response to light incident on the pixel cell. Each pixel cell typically includes a transistor for transferring charge from the photo-conversion device to a sensing node, and a transistor, for resetting a sensing node to a predetermined charge level prior to charge transference. The pixel cell also typically includes a source follower transistor for receiving and amplifying charge from the sensing node and an access transistor for controlling the readout of the cell contents from the source follower transistor.

In a conventional CMOS image sensor, the photo-conversion device converts photons to charge and accumulates the photo-generated charge, while other active elements of the pixel cells, such as transistors, amplify the charge.

CMOS image sensors of the type discussed above are generally known as discussed, for example, in Nixon et al., "256×256 CMOS Active Pixel Sensor Camera-on-a-Chip," IEEE Journal of Solid-State Circuits, Vol. 31(12), pp. 2046-2050 (1996); and Mendis et al., "CMOS Active Pixel Image Sensors," IEEE Transactions on Electron Devices, Vol. 41(3), pp. 452-453 (1994). See also U.S. Pat. Nos. 6,177,333 and 6,204,524, which describe operation of conventional CMOS image sensors, the contents of which are incorporated herein by reference.

The basic structure of a photodiode conventionally used in CMOS image sensors includes a p-n junction typically formed as doped regions in a silicon substrate, wherein the p-n junction is operated under a reverse-biased electrical field. The photon to charge conversion occurs as the photons are absorbed into the photodiode and the energy from the light induces ionization in the depletion region at the p-n junction by causing the electrons of the ionized atoms to move from the valence band to the conduction band, leaving behind a hole. The amount of charge generated is proportional to the intensity of the incident light on the photodiode.

Figure 1:
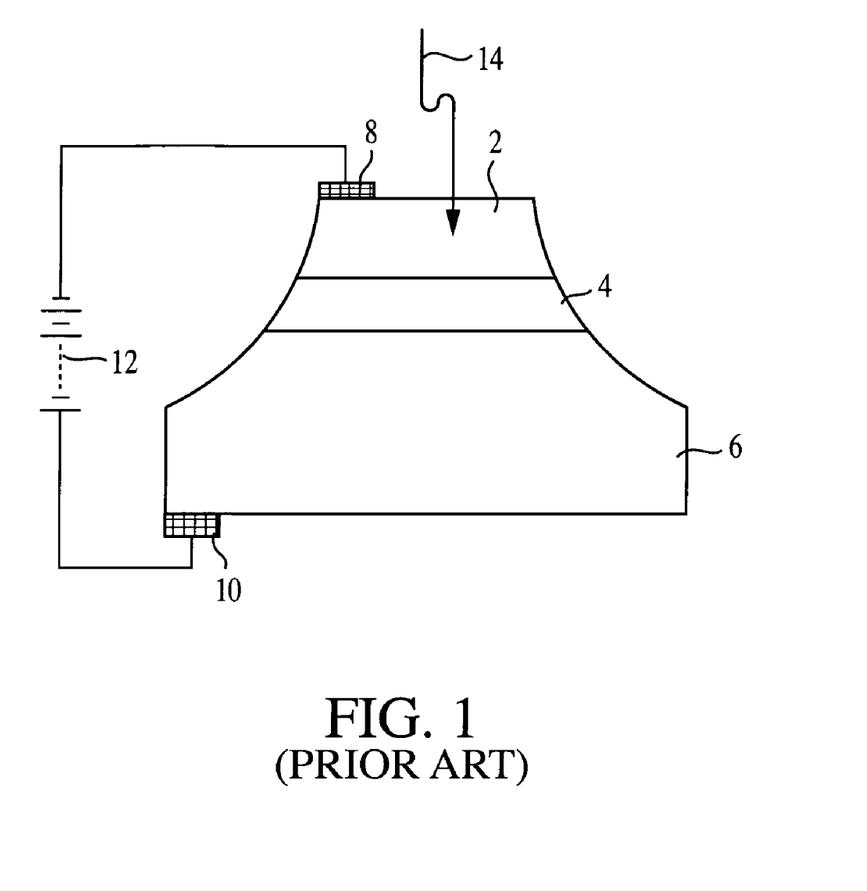
FIG. 1 is an exemplary diagram of an avalanche photodiode as known in the art.

Other optoelectronic devices use different types of photodiodes. For example, avalanche photodiodes have been used in light detectors to convert incident light into electrical charge. In addition to photon-to-charge conversion, avalanche photodiodes amplify the photo-generated charge. An example of an avalanche photodiode (APD) is shown in FIG. 1, and includes a light absorbing layer 2, a multiplication layer 4, and a substrate 6. Electrodes 8 and 10 are placed in contact with the light absorbing layer 2 and the substrate 6, respectively, and a bias source 12 connected between the electrodes 8, 10 to create an electric field through the entire APD structure. The layers of the APD are typically materials which consist of Group III and V elements of the periodic table.

Light 14 is directed onto the light absorbing layer 2 and the energy from the photons generates the initial charge carriers by creating a number of electron-hole pairs in the previously neutral atoms of the material of the light absorbing layer. The initially created carriers, electrons and holes, are moved by the electric field into the multiplication layer 4. The holes and electrons generated by the incident light may gain energy as they move to layer 4. When a hole or electron has acquired sufficient energy it may subsequently undergo impact ionization collisions and create a second generation of electrons and holes. Additionally, carriers of the first generation as well as subsequent generations, may then gain energy to ionize, generating more carriers, and so forth. In this manner, the electrical charge generated by the incident light is amplified.

The secondary and subsequent generations of charge carriers may acquire sufficient energy to impact ionize by drifting through the material in the presence of the electric field, as described by R J. McIntyre, "A New Look at Impact Ionization—Part I: A Theory of Gain, Noise, Breakdown Probability, and Frequency Response," IEEE Transactions on Electron Devices, vol. 46, No. 8, August 1999, the disclosure of which is hereby incorporated by reference.

Avalanche photodiodes amplify charge, but the amplification process may also produce significant noise, typically referred to as the excess noise factor F. In the well recognized article entitled "Multiplication Noise in Uniform Avalanche Diodes," IEEE Transactions on Electron Devices, vol. 13, pp. 164-168, 1966, which is incorporated herein by reference, R. J. McIntyre demonstrates that the excess noise factor can be minimized by maximizing the number of ionizing collisions by one type of carrier and minimizing impact ionizations by the other.

The excess noise factor, F, can be described by the following equation:

$$F(M)=kM+(2-1/M)(1-k),$$

where M is the current multiplication factor, and k is the ratio of a first carrier type ionization rate to the second carrier type ionization rate. In the presence of a relatively low electric field, k is a function of the magnitude of the electric field and the rate of change of the electric field. The higher the electric field in a region that a carrier has moved from, the more likely it is that the carrier will ionize.

It would be advantageous to provide a CMOS image sensor that includes a photo-conversion device capable of charge amplification and with reduced noise for minimized dark current.

BRIEF SUMMARY OF THE INVENTION

Embodiments of the present invention provide a pixel cell for an image sensor that includes a photodiode, which provides high gain, low noise, and low dark current.

The pixel cell of the present invention includes a photodiode which is formed having a heterostructure. The heterostructure comprises layers of a first material having a first band gap and at least a second material having a second band gap in contact with one another. The layers of the photodiode may be formed of a variety of materials, such as Si, $Si_xGe_{1-x}$, $Si_xGe_{1-x}C_y$, and Group III-V materials, for example, GaAs, GaAlAs, InP, InGaAs, or InGaAsP. The layers may be formed by techniques such as epitaxy, chemical vapor deposition, atomic layer deposition, and/or implantation.

The photodiode generates charge in response to light and also amplifies the charge to improve the gain of the pixel cell. Additionally, the heterostructure may be configured such that the layers have band gaps which suppress impact ionization collisions of one type of charge carrier while increasing impact ionizations of the other type of charge carrier to reduce noise and, therefore, dark current. The pixel cell also includes a gate of a transistor adjacent to the photodiode and may include readout circuitry for reading out charge generated and amplified by the photodiode.

BRIEF DESCRIPTION OF THE DRAWINGS

The foregoing and other aspects of the invention will be better understood from the following detailed description of the invention, which is provided in connection with the accompanying drawings, in which.

DETAILED DESCRIPTION OF THE INVENTION

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, silicon-germanium-carbide, germanium, or gallium-arsenide.

The term "pixel cell" refers to a picture element unit cell containing a photo-conversion device and other devices, for example, transistors, for converting electromagnetic radiation to an electrical signal. For purposes of illustration, a representative pixel cell is illustrated in the figures and described herein, and typically fabrication of all pixel cells in an image sensor will proceed simultaneously in a similar fashion.

Embodiments of the invention provide a pixel cell for a CMOS image sensor, which includes a photodiode that provides charge amplification by causing carriers generated by incident light to create additional carriers by impact ionization. The photodiode has a heterostructure, which promotes impact ionization by a first type of carrier, electrons or holes, such that the first carrier type engages in a greater number of impact ionizations than does the second carrier type. By providing a photodiode that creates additional carriers to amplify charge generation, the gain of the photodiode is increased. Additionally, by suppressing impact ionization by the second carrier type, noise is minimized, thereby reducing dark current.

Figure 2:
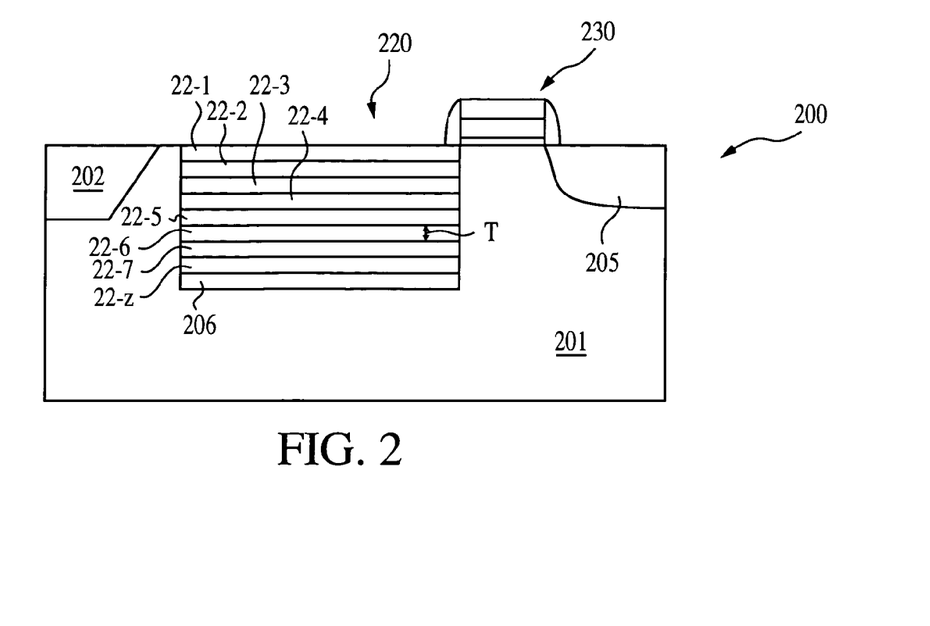
FIG. 2 is a is a diagrammatic side sectional view of a pixel cell according to an exemplary embodiment of the invention.

FIG. 2 is a diagrammatic side sectional view of a portion of a pixel cell 200 according to an exemplary embodiment of the invention. Pixel cell 200 includes a substrate 201 and an isolation region, which is illustratively a shallow trench isolation (STI) region 202. There is also a photodiode 220. Adjacent to photodiode 220 is a gate structure 230 of a transistor. Illustratively, gate structure 230 is the gate structure of a transfer transistor for transferring charge generated by photodiode 220. Adjacent to gate structure 230 and on a side of gate structure 230 opposite to photodiode 220 is a sensing node, which is illustratively a floating diffusion region 205 for receiving charge transferred from photodiode 220.

Photodiode 220 has a heterostructure, which includes layers of at least two different materials. Illustratively, photodiode 220 includes layers 22-1, 22-2, 22-3, 22-4, 22-5, 22-6, 22-7, and 22-z; but photodiode 220 is not limited to a specific number of layers and, therefore, additional or fewer layers may be used. For example and without being limiting, photodiode 220 may include approximately 10 to approximately 100 layers.

If desired, pixel cell 200 can also include a graded buffer layer between a bottom layer 22-z of photodiode 220 heterostructure and substrate 201. Where forming a bottom layer 22-z of the photodiode 220 heterostructure in contact with substrate 220 would result in lattice mismatch, graded buffer layer 206 may be used to reduce strain from lattice mismatch as is known in the art.

Each of the layers 22-1 through 22-z has a thickness. For example, layer 22-6 is shown having a thickness T. Each of the layers of photodiode 220 can have a same thickness. Alternatively, certain layers or all layers of photodiode 220 can have different thicknesses. For example and without being limiting, the layers of photodiode 220 can each have a thickness within the range of approximately 50 Angstroms (Å) to approximately 300 Å.

At least a portion of the photodiode 220 heterostructure is formed such that each individual layer has a different band gap than the layer or layers in contact with the individual layer. A band gap is typically defined as the energy separation between the top of the valence band and the bottom of the conduction band.

Illustratively, all layers 22-1 through 22-z of photodiode 220 are each in contact with a layer of a material having a different band gap. For example, layer 22-1 has a first band gap and is in contact with layer 22-2, which has a second band gap. In turn, layer 22-2 is in contact with layer 22-3, which may have the first band gap. Photodiode 220 can also comprise layers having three or more different band gaps, and have a layering structure as is desired. Illustratively, photodiode 220 comprises layers of two materials each having a different band gap. The materials are alternated such that layers 22-1, 22-3, 22-5, and 22-7 are formed of a first material; and layers 22-2, 22-4, 22-6, and 22-z are formed of a second material.

Figure 3:
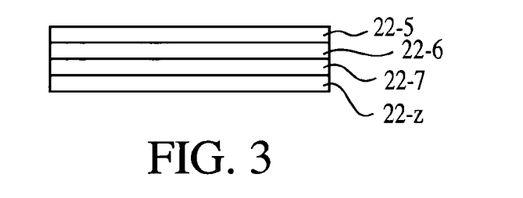
FIG. 3 is a diagrammatic side sectional view of a portion of the photodiode of the pixel cell of FIG. 2.
Figure 4A:
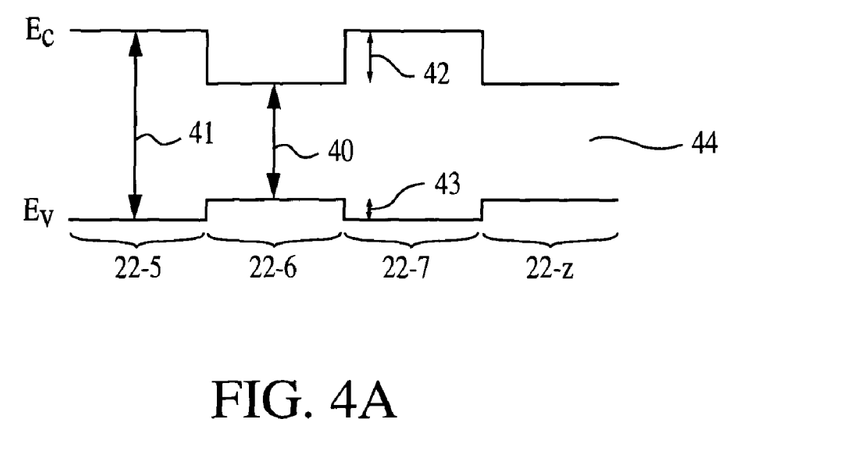
FIGS. 4A and 4B are exemplary energy band diagrams for the portion of the photodiode shown in FIG. 3.
Figure 4B:
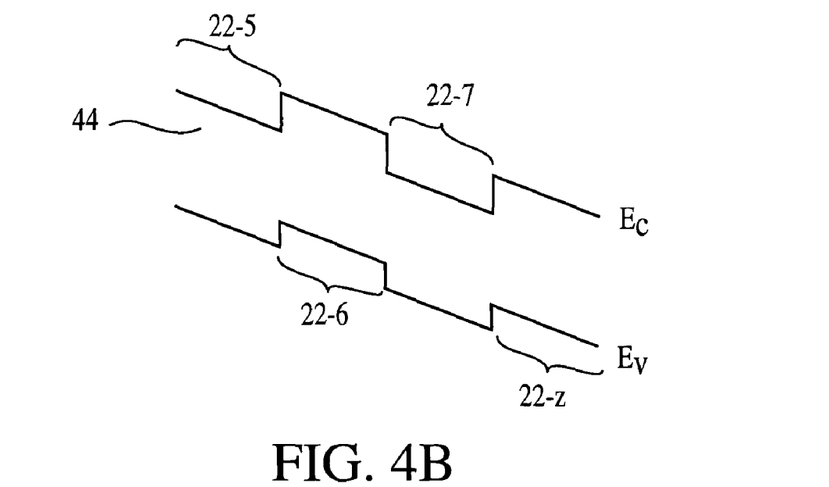

FIG. 3 illustrates layers 22-5 through 22-z of the photodiode 220 heterostructure. FIG. 4A is an energy band diagram illustrating the band energies of layers 22-5 through 22-z of the photodiode 220 heterostructure, and FIG. 4B is an energy band diagram of the layers illustrating band bending in the presence of an applied electric field, which is illustratively a reverse bias. Ec represents the energy level of the conduction band and Ev represents the energy level of the valence band. Between Ec and Ev is the forbidden gap 44, where carriers (electrons or holes) ideally do not have any allowed energy state.

As shown in FIG. 4A, the second material has a greater band gap than the first material. Accordingly, there is a greater difference in Ec and Ev, represented by reference numeral 40, for the second material of layers 22-6 and 22-z than for the first material of layers 22-5 and 22-7, represented by reference numeral 41. The difference between the levels of Ec for the first and second materials is illustrated by reference numeral 42 and is greater than the difference between the levels of Ev for the first and second materials, represented by reference numeral 43.

Carriers are accelerated through the layers in the presence of the electric field and gain energy. Electrons gain energy as they move from a material having a lower Ec to a material having a higher Ec, whereas holes gain energy upon moving from a material having a lower Ev to a material having a higher Ev. When a carrier has gained a sufficient amount of energy, it ionizes. Ionization occurs more often when a carrier moves from a material having a larger band gap to a material having a narrower one. For example, an electron moving from the first material having a band gap 41 to the second material having a narrower band gap will more likely ionize in the second material. Also, an electron (or hole) is more likely to undergo impact ionization if it has just left a region of higher electric field than if it has come from a region of low electric field.

In the example of FIGS. 4A and 4B, electrons gain more energy than holes because of the greater difference between the levels of Ec for the materials, 42. Consequently, electrons have a greater ionization rate than holes. Ionization by electrons is promoted by maximizing the difference in Ec, 42, between the materials, whereas ionization by holes is suppressed by minimizing the difference in Ev, 43, between the materials.

Although the first and second materials are shown having band gaps such that there is a greater difference between Ec than Ev, first and second materials can be chosen such that there is a greater difference in Ev than Ec. In such a case, holes would gain more energy than electrons and, therefore, would have a greater ionization rate than electrons.

Similar principles apply where photodiode 220 includes layers having three or more band gaps. In such a case, the layers are arranged depending on their respective band gaps, Ev, and Ec levels to promote ionization by one carrier type and suppress ionization by the other carrier type.

Photodiode 220 can be formed of a variety of materials. For example, layers of the photodiode heterostructure may be formed of Si, $Si_xGe_{1-x}$, $Si_xGe_{1-x}C_y$, and Group III-V materials, such as, for example GaAs, GaAlAs, InP, InGaAs, or InGaAsP. As is known in the art x, y, and similarly used characters, such as z, represent mole fractions of particular elements. Although it is possible for x and y to equal 1 or zero, for purposes of this specification, where an element is represented having a mole fraction, it is a representation that the element has a mole fraction greater than zero. Accordingly, different materials having different mole fractions of elements may be represented by a same general notation. Also, a same character used to represent mole fractions of a same element in two different materials need not have a same value.

Exemplary layering structures for photodiode 220 according to embodiments of the invention are described below. The particular layering structures described below are exemplary only and are not limitations to the scope of the invention.

Photodiode 220 can be formed of alternating layers of p-type Si and n-type SiGe and has a p-Si/n-SiGe structure. In such a case, for example, layers 22-1, 22-3, 22-5, and 22-7 are n-type SiGe layers; and layers 22-2, 22-4, 22-6, and 22-z are p-type Si layers.

Also, photodiode 220 can be formed of alternating layers of Si and SiGe, where subsets of layers are doped to have p-type or n-type conductivity and the subset of layers are alternating such that photodiode 220 has, for example a p-(Si/SiGe; Si/SiGe)/n-(Si/SiGe; Si/SiGe) structure. In such a case, for example, layers 22-1, 22-3, 22-5, and 22-7 are SiGe layers; and layers 22-2, 22-4, 22-6, and 22-z are Si layers, where layers 22-1 through 22-4 are p-type layers and layers 22-5 through 22-z are n-type layers.

Photodiode 220 can also be formed of alternating layers of $Si_xGe_{1-x}$ and $Si_yGe_{1-y}$, or alternating layers of $Si_xGe_{1-x}C_y$ and $Si_xGe_yC_z$. The layers can be doped with p or n-type dopants and may form similar layering structures to those described above in connection with the layering structure of Si and SiGe.

Additionally, subsets of the layers of photodiode 220 can be formed such that they perform a particular function of photodiode 220. For example, the photodiode 220 heterostructure can include a photon-absorption region for absorbing photons from incident light to generate initial carriers, and a multiplication region for amplifying the carriers as described above. Each of the regions would include one or more of the layers 22-1 through 22-z. A description of such regions and design considerations therefore are included in V. Chandramouli et al., "Design Consideration for High Performance Avalanche Photodiode Multiplication Layers," *IEEE Transactions on Electron Devices*, vol. 41, pp. 648-654, 1994, which is incorporated herein by reference.

The process for fabricating pixel cell 200 is described below with reference to FIGS. 5A-5E. No particular order is required for any of the actions described herein, except for those logically requiring the results of prior actions. Accordingly, while the actions below are described as being performed in a general order, the order is exemplary only and can be altered.

Figure 5A:
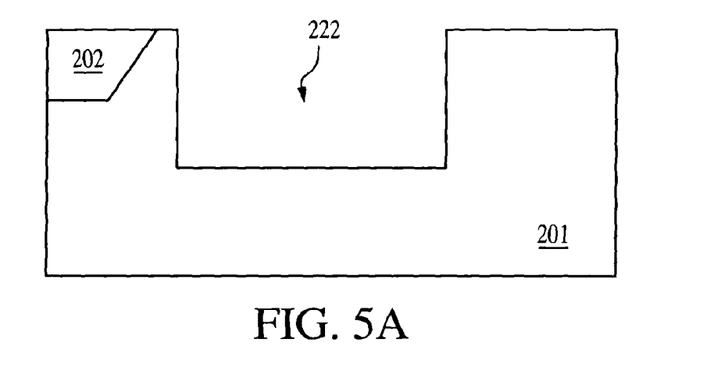
FIG. 5A depicts the FIG. 2 pixel cell at an initial stage of processing.

FIG. 5A illustrates a substrate 201. For exemplary purposes the substrate 201 is a silicon substrate slightly doped with a dopant of a first conductivity type, which for exemplary purposes is p-type. As noted above, however, the invention has application to other substrates.

FIG. 5A also illustrates an isolation region 202, which is formed within the substrate 201 and filled with a dielectric material, which can be an oxide material, for example a silicon oxide, such as SiO or $SiO_2$; oxynitride; a nitride material, such as silicon nitride; silicon carbide; a high temperature polymer; or other suitable dielectric material. As noted above isolation region 202 is illustratively a shallow trench isolation (STI) region and the dielectric material is a high density plasma (HDP) oxide, a material which has a high ability to effectively fill narrow trenches.

Figure 5B:
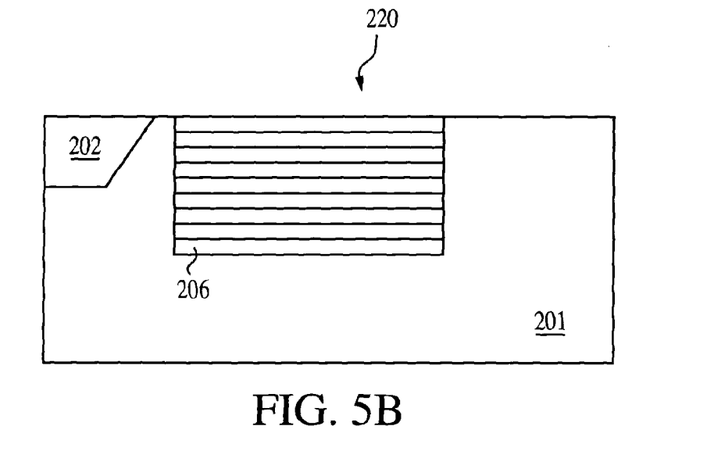
FIG. 5B depicts the FIG. 2 pixel cell at an intermediate stage of processing.

Before or after the formation of STI region 202, a trench 222 can be formed in substrate 201 where photodiode 220 is to be formed. As shown in FIG. 5B, photodiode 220 is formed in the trench 222 such that a top layer 22-1 is at a level approximately below a top surface of substrate 201. Although, the layers 22-1 through 22-z are shown below a top surface of substrate 201, one or more layers of the photodiode 220 heterostructure may be at a level above the substrate 201 surface as shown in FIG. 5F.

The layers 22-1 through 22-z each can be formed by methods known in the art, such as, for example, epitaxy, chemical vapor deposition (CVD), and atomic layer deposition (ALD). For example, alternating layers of Si and SiGe can be grown or deposited in trench 222 to form a Si/SiGe structure. In such a case, for example, layers 22-1, 22-3, 22-5, and 22-7 may be SiGe layers; and layers 22-2, 22-4, 22-6, and 22-z are Si layers.

Each of the layers 22-1 through 22-z can be doped in-situ by known techniques. For example, layers 22-1, 22-3, 22-5, and 22-7 are be doped with an n-type dopant, such as phosphorus or arsenic, among others; and layers 22-2, 22-4, 22-6, and 22-z are doped with a p-type dopant, such as boron or indium, among others.

Alternatively, layers 22-1 through 22-z each can be formed by implantation techniques as is known in the art. In such a case, no trench would be formed, and desired dopants would be implanted into substrate 201 to form the photodiode 220 heterostructure. As is known in the art, however, implantation techniques are not suited for forming thin layers. Accordingly, where layers 22-1 through 22-z are to be formed having a small thickness, the above mentioned techniques, particularly ALD, should be used.

Additionally, if desired graded buffer layer 206 may be formed between photodiode 220 and substrate 201 by known techniques. The composition of graded buffer layer 206 depends on the compositions of the substrate and bottom layer 22-z of photodiode 220. For example, where substrate 201 is a silicon (Si) substrate and bottom layer 22-z is $Si_xGe_{1-x}$, a graded buffer layer can be formed between substrate 201 and layer 22-z such that the bottom portion of the graded buffer layer 206 in contact with substrate 201 is $Si_yGe_{1-y}$, where y is approximately 1, and a top portion of graded buffer layer 206 is $Si_yGe_{1-y}$, where x is approximately equal to y. The composition of the graded buffer layer 206 changes from the bottom portion to the top portion, such that the value of y changes, for example, linearly until y is approximately equal to x.

Figure 5C:
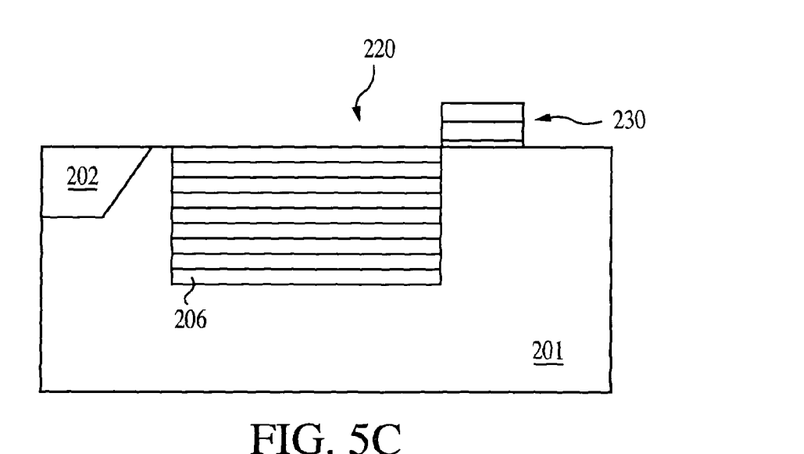
FIG. 5C depicts the FIG. 2 pixel cell at an intermediate stage of processing

As shown in FIG. 5C, a gate structure 230 is formed adjacent to photodiode 220. For this, a first insulating layer, which can be silicon oxide is grown or deposited on the substrate 201. The first layer will be the gate oxide layer for the subsequently formed transistor gate. Next, a layer of conductive material is deposited over the first oxide layer. The conductive layer will serve as the gate electrode for the subsequently formed transistor. The conductive layer may be a layer of polysilicon, which can be doped to a second conductivity type, e.g. n-type. A second insulating layer is deposited over the polysilicon layer. The second insulating layer can be formed of an oxide ($SiO_2$), a nitride (silicon nitride), an oxynitride (silicon oxynitride), ON (oxide-nitride), NO (nitride-oxide), or ONO (oxide-nitride-oxide).

These layers can be formed by conventional deposition methods, such as chemical vapor deposition (CVD) or plasma chemical vapor deposition (PECVD), among others. These layers are then patterned and etched to form the multilayer gate stack structure 230 shown in FIG. 5C.

The invention is not limited to the gate structure 230 described above. Additional layers can be added or gate structure 230 can be altered as is desired and known in the art. For example, a silicide layer (not shown) can be formed between the gate electrode and the second insulating layer. The silicide layer can be included in gate structure 230, or in all of the transistor gate structures in an image sensor circuit, and may be titanium silicide, tungsten silicide, cobalt silicide, molybdenum silicide, or tantalum silicide. This additional conductive layer can also be a barrier layer/refractor metal, such as TiN/W or $W/N_x/W$, or it could be formed entirely of $WN_x$.

Figure 5D:
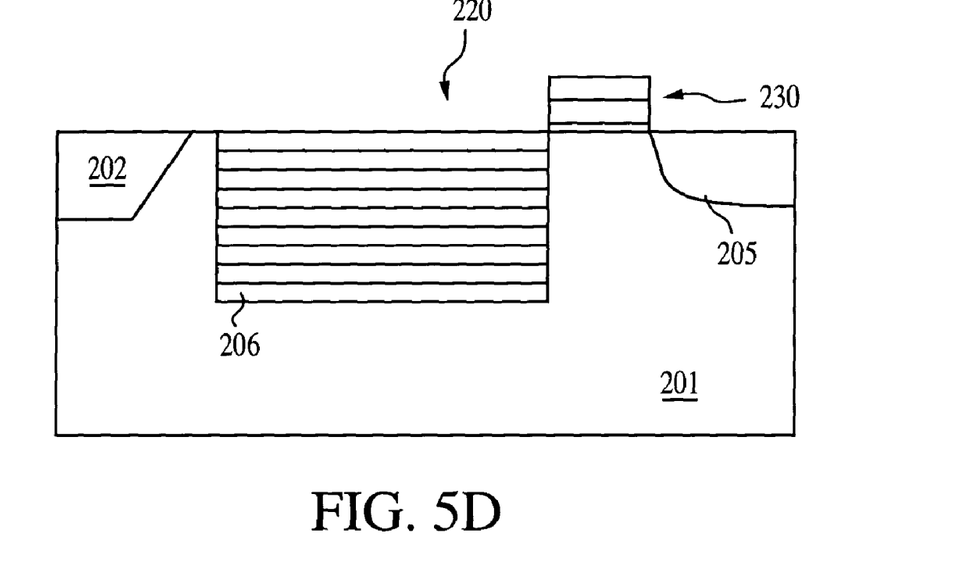
FIG. 5D depicts the FIG. 2 pixel cell at an intermediate stage of processing

Referring to FIG. 5D, a sensing node 205 is formed adjacent to the gate structure 230 and on an opposite side of the gate structure 230 from photodiode 220. Illustratively, the sensing node 205 is a floating diffusion region. Floating diffusion region 205 is formed in the substrate 201 by known methods as a doped region of second conductivity type, which is illustratively n-type.

Figure 5E:
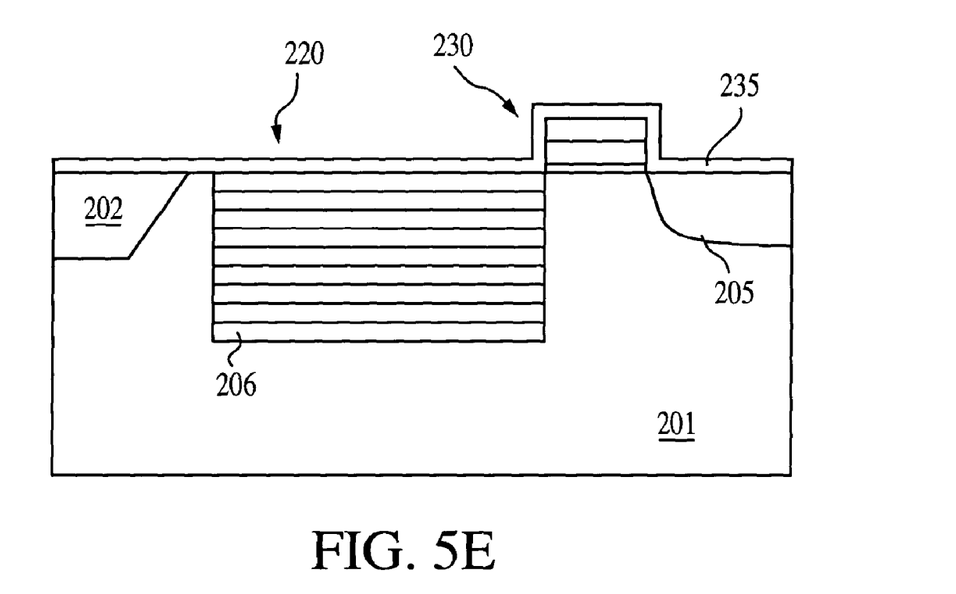
FIG. 5E depicts the FIG. 2 pixel cell at an intermediate stage of processing
Figure 5F:
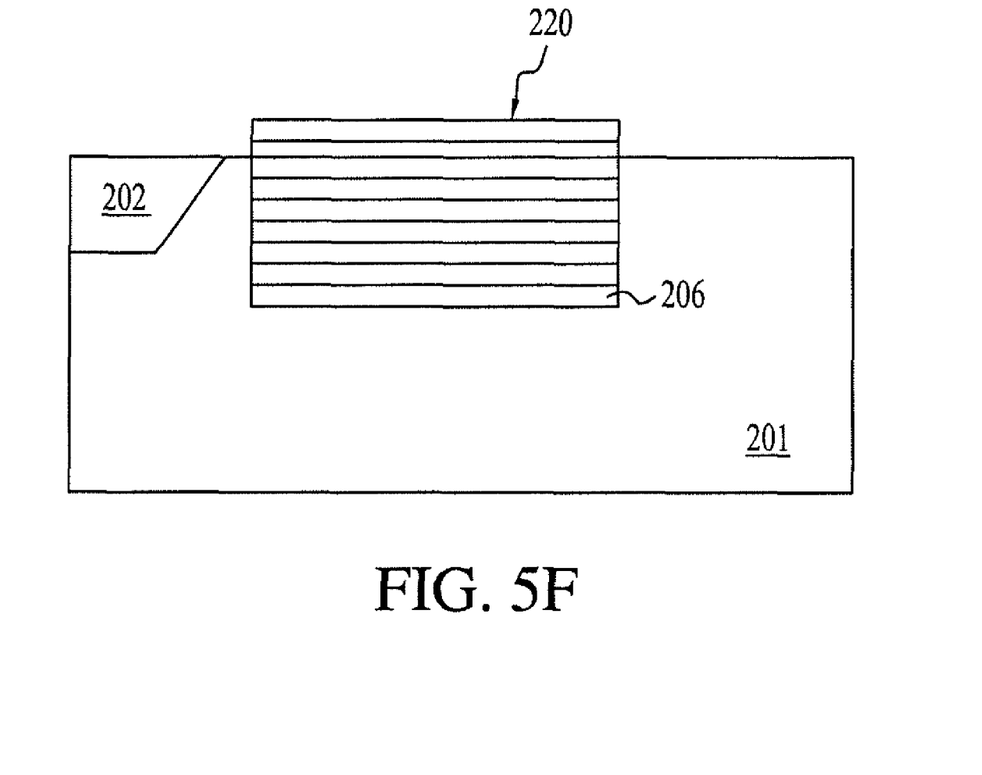
FIG. 5F depicts a pixel cell at an intermediate stage of processing.

An insulating layer 235 is formed over substrate 201 and over gate structure 230, as shown in FIG. 5E. Layer 235 can be etched to form sidewall spacers on gate structure 230 and other gate structures (not shown) of pixel cell 200, or layer 235 can remain over photodiode 220, gate structure 230 and the area where floating diffusion 205 is to be formed. Layer 235 is an appropriate dielectric material, such as silicon dioxide, silicon nitride, an oxynitride, ON, NO, ONO, or TEOS, among others.

Conventional processing methods can be used to complete pixel cell 200. For example, insulating, shielding, and metallization layers to connect gate lines and other connections to pixel cell 200 can be formed. Also, the entire surface can be covered with a passivation layer (not shown) of, for example, silicon dioxide, BSG, PSG, or BPSG, which is CMP planarized and etched to provide contact holes, which are then metallized to provide contacts. Conventional layers of conductors and insulators can also be used to interconnect the structures and to connect pixel cell 200 to peripheral circuitry.

Figure 6:
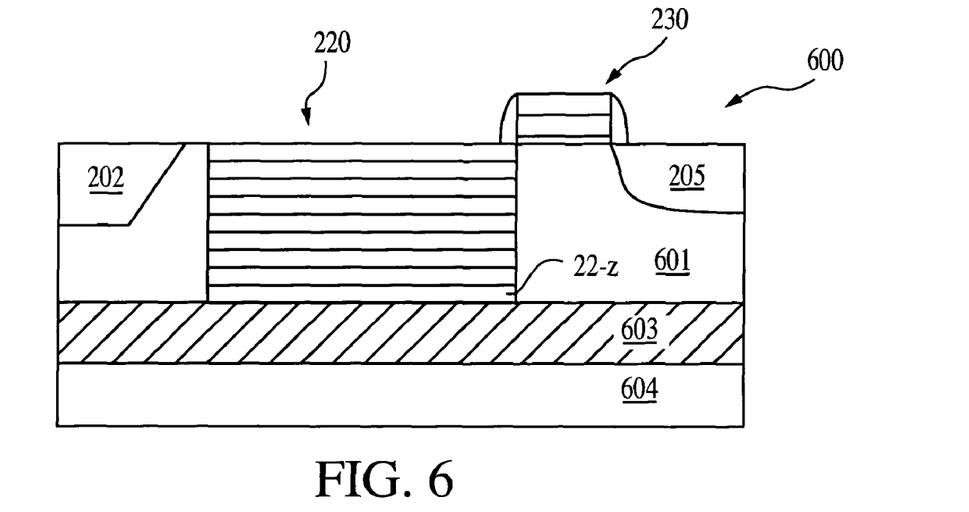
FIG. 6 is a is a diagrammatic side sectional view of a pixel cell according to an exemplary embodiment of the invention.

Alternatively, as noted above, a pixel cell according to embodiments of the invention can be formed on an SOI substrate. FIG. 6 illustrates a pixel cell 600 including an SOI substrate. Pixel cell 600 is the similar to pixel cell 200 and is formed as described above in connection with FIGS. 2-5E, except that pixel cell 600 is formed on an SOI substrate 601. Accordingly, pixel cell 600 includes a buried oxide layer 603 over a silicon base 604. As shown in FIG. 6, photodiode 220 is formed over buried oxide layer 603, and the bottom layer 22-z of photodiode 220 can be formed on buried oxide layer 603.

Illustratively, SOI substrate 601 has a thickness within the range of approximately 500 Angstroms (Å) to approximately 3000 Å. The thickness of the SOI substrate 601 can depend on the total thickness of photodiode 220. For example, SOI substrate 601 can be approximately as thick as the portion of photodiode 220 that is below a top surface of SOI substrate 601.

Typically, CMOS image sensors are built on silicon substrates. Other devices, however, such as high performance logic transistors, are increasingly being built on SOI substrates. SOI substrates provide significant performance gains, for example, higher speed and lower leakage, over conventional silicon substrates. Integrating CMOS image sensors in a SOI substrate has proved to be difficult for the following reasons: 1) poor photodiode fill factor, where the total area occupied by the photodiode is small, resulting in poor sensitivity; 2) the need for larger pixel size and associated die-size increase due to poor fill factor; and 3) higher dark current due to the buried oxide interface.

In a pixel cell according to embodiments of the present invention, it is possible to use SOI substrates because carriers are amplified in photodiode 220 as described above in connection with FIGS. 2-4. In addition, buried oxide layer 603 allows the creation of an optical resonant cavity where buried oxide layer 603 serves as a bottom reflector for photons incident in the bottom layer 22-z of the photodiode 220. In the absence of buried oxide layer 603, photons can be absorbed deep within the silicon substrate 201 (FIG. 2), e.g., infra-red and red photons, and can be lost due to diffusion, resulting in poorer quantum efficiency. By providing a buried oxide layer 603, such photons have a higher probability of being reflected from the buried oxide layer 604 and being absorbed into the photodiode 220, resulting in higher quantum efficiency.

Figure 7:
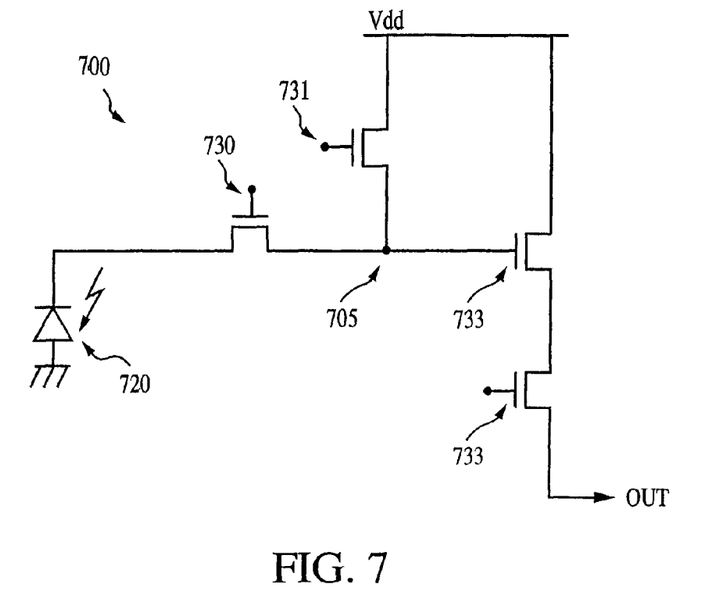
FIG. 7 is a schematic diagram of a pixel cell according to an exemplary embodiment of the invention.

A schematic diagram of an exemplary pixel cell 700 according to an embodiment of the invention is shown in FIG. 7. Pixel cell 700 is formed as described above in connection with FIGS. 2-6. Illustratively, the CMOS pixel cell 700 is a four transistor (4T) cell. Pixel cell 700 comprises a photodiode 720. Pixel cell 700 also includes a transfer gate 730 for transferring photo-generated and amplified charge from photodiode 720 to a sensing node, which is illustratively a floating diffusion region 705. The floating diffusion region 705 is electrically connected to the gate of an output source follower transistor 732. The pixel cell 700 also includes a reset transistor having a gate 731 for resetting the floating diffusion region 705 to a predetermined voltage before sensing a signal. Source follower transistor 732 receives at its gate an electrical signal from the floating diffusion region 705. There is also a row select transistor 733 for outputting a signal from the source follower transistor 723 to an output terminal in response to an address signal. Source follower transistor and row select transistor serve as readout circuitry for pixel cell 700.

Figure 8:
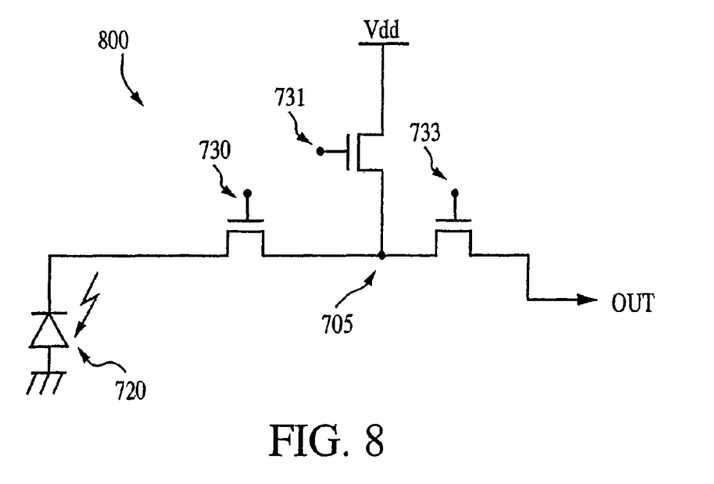
FIG. 8 is a schematic diagram of a pixel cell according to an exemplary embodiment of the invention.

FIG. 8 is a schematic diagram of a pixel cell 800 according to an exemplary embodiment of the invention, which is similar to the embodiment described above in connection with FIG. 7, except that pixel cell 800 does not include a source follower transistor. Because photodiode 720 amplifies charge, readout circuitry for amplifying charge, such as a source follower transistor may be eliminated. Instead, a source/drain region of a row select transistor 733 is electrically connected to the floating diffusion region for outputting a signal from the floating diffusion region in response to an address signal.

Although the invention is described in connection with three-transistor (3T) and four-transistor (4T) pixel cells that each include a transfer transistor, the invention may also be incorporated into other CMOS pixel cell designs having different numbers of transistors, which may perform different functions. Without being limiting, such a design can include a five-transistor (5T) cell or a six-transistor (6T) cell. Five-transistor and six-transistor pixel cells differ from the 3T and 4T cells by the addition of transistors, such as a shutter transistor or an anti-blooming transistor.

Also, while the invention is described in connection with a CMOS image sensor, the invention is also applicable to analogous structures of a Charge Coupled Device (CCD) image sensor.

Figure 9:
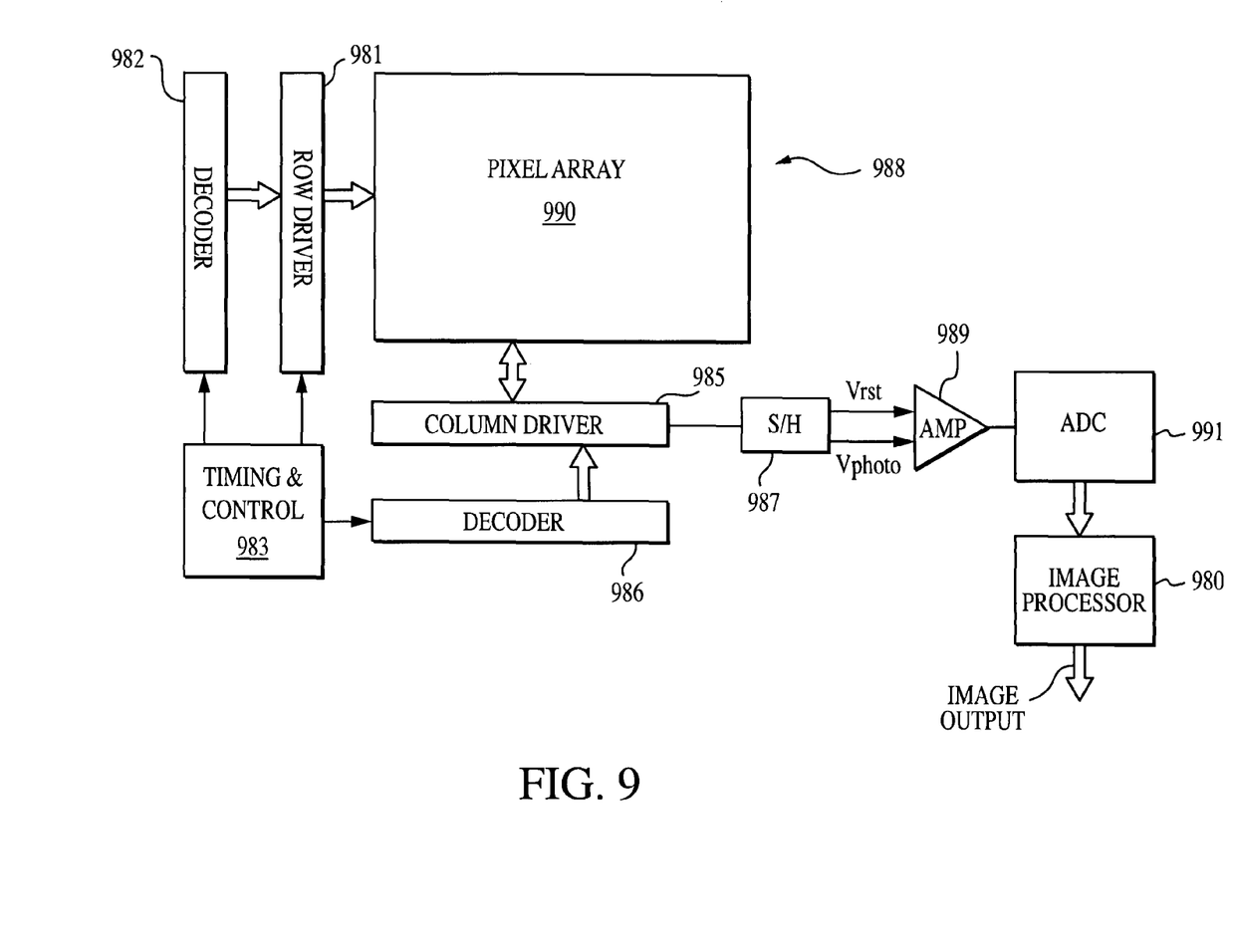
FIG. 9 is a simplified block diagram of an image sensor according to an exemplary embodiment of the invention.

FIG. 9 is a block diagram of an exemplary CMOS image sensor 988 according to an embodiment of the invention. The imaging device has a pixel array 990 containing a plurality of pixel cells arranged in rows and columns. The array 990 may include pixel cells 700 or 800 as described above in connection with FIGS. 7 and 8.

The image sensor 988 operates as is known in the art. Accordingly, the pixels of each row in array 990 are all turned on at the same time by a row select line, and the pixels of each column are selectively output by respective column select lines. The row lines are selectively activated by a row driver 981 in response to row address decoder 982. The column select lines are selectively activated by a column driver 985 in response to column address decoder 986. Pixel array 990 is operated by the timing and control circuit 935, which controls address decoders 982, 986 for selecting the appropriate row and column lines for pixel signal readout. The pixel column signals, which typically include a pixel reset signal ($V_{rst}$) and a pixel image signal ($V_{photo}$), are read by a sample and hold circuit (S/H) 987 associated with the column driver 965. A differential signal ($V_{rst}-V_{photo}$) is produced by differential amplifier (AMP) 989 for each pixel which is amplified and digitized by analog to digital converter (ADC) 991. The analog to digital converter 991 supplies the digitized pixel signals to an image processor 980 which forms a digital image.

As is known in the art, circuitry peripheral to array 990 can include logic transistors. Where pixel cells 700 or 800 of the array 990 are formed on a SOI substrate as discussed above in connection with FIG. 6, the peripheral circuitry can also be formed by known methods on an SOI substrate. In such a case, image sensor 988 will have the additional advantage of including high performance logic transistors.

Figure 10:
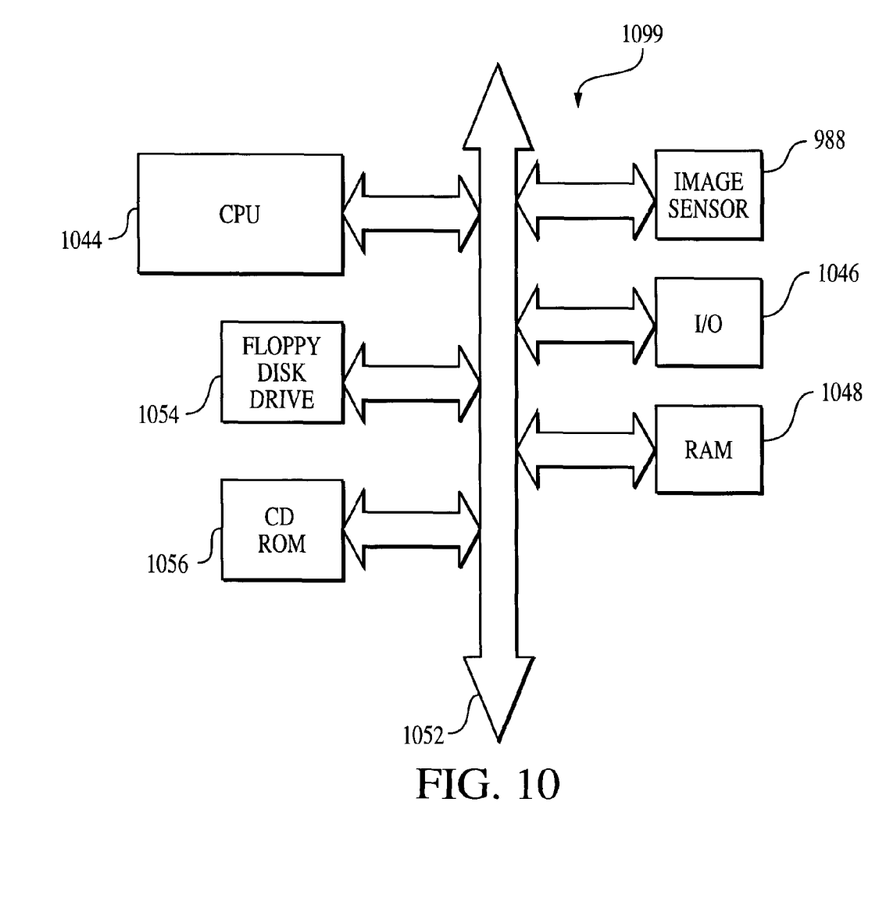
FIG. 10 illustrates a simplified block diagram of a computer processor system incorporating the FIG. 9 image sensor.

A typical processor-based system 1099 including an image sensor device 988 having an array of pixels, which includes pixels according to the embodiments of the present invention, is illustrated generally in FIG. 10. Processor-based system 1099 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

Processor-based system 1099, for example a computer system, generally comprises a central processing unit (CPU) 1044, such as a microprocessor, that communicates with an input/output (I/O) device 1046 over a bus 1052. Image sensor 988, which produces an image output from a pixel array, also communicates with the CPU 1044 over bus 1052. Processor-based system 1099 also includes random access memory (RAM) 1048, and may include peripheral devices, such as a floppy disk drive 1054 and a compact disk (CD) ROM drive 1056, which also communicate with CPU 1044 over the bus 1052. Image sensor 988 may be combined with a processor, such as a CPU, digital signal processor, or microprocessor, with or without memory storage on a single integrated circuit or on a different chip than the processor.

It is again noted that the above description and drawings are exemplary and illustrate preferred embodiments that achieve the objects, features and advantages of the present invention. It is not intended that the present invention be limited to the illustrated embodiments. Any modification of the present

What is claimed as new and desired to be protected by Letters Patent of the United States is:

1. A method of forming a pixel cell for an image sensor, the method comprising:
   forming a photodiode, the act of forming the photodiode comprising forming a plurality of layers within a substrate, the plurality of layers comprising at least a first layer of a first material, a second layer of a second material, a third layer of the first material, and a fourth layer of the second material, wherein the first material has a first band gap and the second material has a second band gap, wherein layers of like material are not in contact with one another, wherein the first, second, third and fourth layers are configured to promote ionization by a first carrier type and suppress ionization by a second carrier type in the presence of an electric field, wherein the act of forming the layers comprises doping a first subset of layers to a first conductivity type and doping at least a second subset of layers to a second conductivity type, and wherein the first conductivity type is different than the second conductivity type;
   forming a buffer between a bottom layer of the photodiode and the substrate, the act of forming the buffer layer comprises forming a buffer layer with a composition that changes from a bottom surface of the buffer layer to a top surface of the buffer layer, wherein the bottom layer of the photodiode and the top surface of the buffer layer have approximately the same chemical composition;
   forming a first transistor for transferring the first carrier type from the photodiode, the transistor formed adjacent to the photodiode; and
   forming a second transistor for coupling the pixel cell to an output line.

2. The method of claim 1, wherein the act of forming the layers comprises forming the layers such that a difference between the conduction band energies of the first and at least second materials is greater than a difference between the valence band energies of the first and at least second materials.

3. The method of claim 1, wherein the act of forming the layers comprises forming the layers such that a difference between the valence band energies of the first and at least second materials is greater than a difference between the conduction band energies of the first and at least second materials.

4. The method of claim 1, wherein the act of forming the layers comprises forming the layers of materials selected from the group consisting of Si, $Si_xGe_{1-x}$, $Si_xGe_{1-x}C_y$, GaAs, GaAlAs, InP, InGaAs, or InGaAsP.

5. The method of claim 1, further comprising forming a floating diffusion region adjacent to the transistor and forming readout circuitry electrically connected to the floating diffusion region for reading out charge.

6. The method of claim 1, wherein the layers are formed by any of chemical vapor deposition, atomic layer deposition, epitaxy and ion implantation.

7. The method of claim 1, wherein the act of forming the photodiode comprises forming at least a portion of the photodiode at a level above a level of a top surface of the substrate.

8. The method of claim 1, wherein the act of forming the layers comprises forming approximately 10 to approximately 100 layers.

9. The method of claim 1, wherein the act of forming the layers comprises forming the layers to each have a thickness of approximately 50 Angstroms to approximately 300 Angstroms.

10. The method of claim 1, wherein the act of forming the photodiode comprises forming the plurality of layers within a surface of a silicon-on-insulator substrate.

11. The method of claim 1, wherein the first, second, third, and fourth layers have a same thickness.

12. The method of claim 1, wherein the at least a first and third layer of the first material are formed to comprise $Si_xGe_{1-x}$, and the at least a second and fourth layer of the second material are formed to comprise $Si_yGe_{1-y}$.

13. The method of claim 1 wherein the at least a first and third layer of the first material are formed to comprise $Si_xGe_{1-x}C_y$, and the at least a second and fourth layer of the second material are formed to comprise $Si_xGe_yC_z$.

14. The method of claim 1, wherein said plurality of layers further comprises a fifth layer of a third material, wherein the third material has a third band gap different from the first band gap and the second band gap.

15. The method of claim 14, wherein the first, second, third, fourth, and fifth layers have a same thickness.

16. The method of claim 1, wherein:
   forming the photodiode comprises forming a bottom layer comprising $Si_xGe_{1-x}$; and
   the buffer layer comprising $Si_yGe_{1-y}$;
   wherein y is approximately x at the top surface of the buffer layer.

17. The method of claim 16, wherein y is approximately 1 at the bottom surface of the buffer layer.

18. A method of forming a pixel cell for an image sensor, the method comprising:
   forming a photodiode, the act of forming the photodiode comprising forming a plurality of layers within a substrate, the plurality of layers comprising at least a first layer of a first material, a second layer of a second material, a third layer of the first material, and a fourth layer of the second material, wherein the first material has a first band gap and the second material has a second band gap, and wherein layers of like material are not in contact with one another, and wherein the first, second, third and fourth layers are configured to promote ionization by a first carrier type and suppress ionization by a second carrier type in the presence of an electric field;
   forming a buffer between a bottom layer of the photodiode and the substrate, the act of forming the buffer layer comprises forming a buffer layer with a composition that changes from a bottom surface of the buffer layer to a top surface of the buffer layer, wherein the bottom layer of the photodiode and the top surface of the buffer layer have approximately the same chemical composition;
   forming a first transistor for transferring the first carrier type from the photodiode, the transistor formed adjacent to the photodiode; and
   forming a second transistor for coupling the pixel cell to an output line,
   wherein the act of forming the layers comprises forming alternating layers of Si and SiGe, wherein the act of forming the layers comprises doping the layers of Si to a first conductivity type and doping the layers of SiGe to a second conductivity type, and wherein the first conductivity type is different than the second conductivity type.

19. A method of forming a pixel cell for an image sensor, the method comprising:
   forming a photodiode, the act of forming the photodiode comprising forming a plurality of layers within a substrate, the plurality of layers comprising at least a first layer of a first material, a second layer of a second material, a third layer of the first material, and a fourth layer of the second material, wherein the first material has a first band gap and the second material has a second band gap, and wherein layers of like material are not in contact with one another, and wherein the first, second, third and fourth layers are configured to promote ionization by a first carrier type and suppress ionization by a second carrier type in the presence of an electric field;

forming a buffer between a bottom layer of the photodiode and the substrate, the act of forming the buffer layer comprises forming a buffer layer with a composition that changes from a bottom surface of the buffer layer to a top surface of the buffer layer, wherein the bottom layer of the photodiode and the top surface of the buffer layer have approximately the same chemical composition;

forming a first transistor for transferring the first carrier type from the photodiode, the transistor formed adjacent to the photodiode; and forming a second transistor for coupling the pixel cell to an output line, wherein the act of forming the layers comprises forming alternating layers of Si and SiGe, wherein the act of forming the layers comprises doping a first subset of layers to a first conductivity type and doping at least a second subset of layers to a second conductivity type, and wherein the first conductivity type is different than the second conductivity type.

20. A method of forming a pixel cell for an image sensor, the method comprising:

forming a trench in a substrate doped with a dopant of a first conductivity type;

forming a photodiode by forming a plurality of alternating layers of Si and SiGe, wherein at least one of the alternating layers is at least partially within the trench, and wherein layers of like material are not in contact with one another;

doping the alternating layers of the photodiode such that they have alternating dopants, a bottom layer being doped with a dopant of a second conductivity type, and a layer immediately above the bottom layer being doped with the dopant of the first conductivity type, wherein the alternating layers of the photodiode are configured to promote ionization by a first carrier type and suppress ionization by a second carrier type in the presence of an electric field; and forming a transistor for transferring the first carrier type from the photodiode, the transistor formed adjacent to the photodiode and over the substrate.

21. The method of claim 20 wherein the alternating layers are formed by any of epitaxy, chemical vapor deposition, and atomic layer deposition.

22. The method of claim 20 further comprising forming a reset transistor for resetting the photodiode to a predetermined voltage.

23. The method of claim 20 further comprising forming the photodiode to be part of a CMOS image sensor.

24. The method of claim 20 further comprising forming the photodiode to be part of a charge coupled device image sensor.

25. The method of claim 20 wherein the alternating layers are $Si_xGe_{1-x}$ and $Si_yGe_{1-y}$.

26. The method of claim 20 wherein the alternating layers are $Si_xGe_{1-x}C_y$ and $Si_xGe_yC_z$.

27. The method of claim 20 further comprising:

forming a buffer layer between the bottom layer of the photodiode and the substrate such that a bottom portion of the buffer layer is in contact with the substrate, and a top portion of the buffer layer is in contact with the bottom layer of the photodiode, the act of forming the buffer layer comprising forming a buffer layer with a composition that changes from the bottom of the buffer layer to the top of the buffer layer.

28. The method of claim 27 further comprising forming a floating diffusion region, wherein the transistor adjacent to the photodiode and over the substrate is a transfer transistor for transferring charge from the photodiode to the floating diffusion region.

* * * * *